(12) United States Patent
Dono

(10) Patent No.: US 8,385,139 B2
(45) Date of Patent: Feb. 26, 2013

(54) SEMICONDUCTOR DEVICE USING PLURAL INTERNAL OPERATION VOLTAGES AND DATA PROCESSING SYSTEM USING THE SAME

(75) Inventor: Chiaki Dono, Tokyo (JP)

(73) Assignee: Elpida Memory, Inc., Tokyo (JP)

(*) Notice: Subject to any disclaimer, the term of this patent is extended or adjusted under 35 U.S.C. 154(b) by 344 days.

(21) Appl. No.: 12/923,248

(22) Filed: Sep. 10, 2010

(65) Prior Publication Data
US 2011/0063927 A1 Mar. 17, 2011

(30) Foreign Application Priority Data
Sep. 11, 2009 (JP) ................................. 2009-211142

(51) Int. Cl.
*G11C 7/00* (2006.01)
(52) U.S. Cl. ......... 365/189.11; 365/189.09; 365/230.08; 365/230.06
(58) Field of Classification Search ............. 365/189.11, 365/189.09, 230.08, 230.06
See application file for complete search history.

(56) References Cited

U.S. PATENT DOCUMENTS

| 5,297,095 A * | 3/1994 | Sato et al. ................. 365/185.22 |
| 6,097,665 A * | 8/2000 | Tomishima et al. ..... 365/230.06 |
| 6,697,992 B2 | 2/2004 | Ito et al. |
| 7,170,339 B2 * | 1/2007 | Saito et al. ....................... 330/10 |
| 7,887,149 B2 * | 2/2011 | Kondoh ............................ 347/9 |

FOREIGN PATENT DOCUMENTS
JP 2002-56671 A 2/2002

* cited by examiner

*Primary Examiner* — Connie Yoha
(74) *Attorney, Agent, or Firm* — McGinn IP Law Group, PLLC

(57) ABSTRACT

A semiconductor device includes an input buffer that receives an address signal having a first amplitude, a level shifter that converts an amplitude of the address signal output from the input buffer to a second amplitude that is smaller than the first amplitude, an address controller that receives the address signal output from the level shifter, address decoders that generate a decode signal by decoding the address signal output from the address controller, and level shifters that convert an amplitude of the address signal or of the decode signal from the second amplitude to the first amplitude such that at least an amplitude level of the decode signal becomes the first amplitude.

20 Claims, 11 Drawing Sheets

US 8,385,139 B2

SEMICONDUCTOR DEVICE USING PLURAL INTERNAL OPERATION VOLTAGES AND DATA PROCESSING SYSTEM USING THE SAME

BACKGROUND OF THE INVENTION

1. Field of the Invention

The present invention relates to a semiconductor device, and particularly relates to a semiconductor device using an internal operation voltage used in each block constituting the semiconductor device. The present invention also relates to a data processing system using the semiconductor device.

2. Description of Related Art

In recent years, an internal operation voltage of a semiconductor device has been reduced along with downscaling of a semiconductor process. For example, in a conventional DRAM (Dynamic Random Access Memory) described with reference to FIG. 3 of Japanese Patent Application Laid-open No. 2002-56671, an internal operation voltage VPERI that is lower than an external voltage VDD is used. A signal output from the semiconductor device to an external device is level-shifted from the internal operation voltage VPERI to the external voltage VDD before being output.

To explain an operation voltage of a DRAM, for example, a DDR2 SDRAM of 60-nm generation has an external voltage VDD of 1.8 V, a peripheral circuit voltage VPERI of 1.3 V, and an array-system circuit voltage VARY of 1.2 V. Meanwhile, a DDR3 SDRAM of 50-nm generation has reduced voltages of the external voltage VDD of 1.5 V, the peripheral circuit voltage VPERI of 1.0 V, and the array-system circuit voltage VARY of 1.0 V. In the 50-nm generation, the peripheral circuit voltage VPERI is equal to the array-system circuit voltage VARY, because a trend toward a decrease of the peripheral circuit voltage VPERI is different from that of the array-system circuit voltage VARY. That is, the array-system circuit voltage VARY cannot be easily reduced any more, considering physical constants of memory cells, such as a memory cell capacitance, a Vth offset of a sense amplifier, and a bit line capacitance, and thus the array-system circuit voltage VARY cannot be reduced along with a reduction trend of a processing dimension.

However, when the peripheral circuit voltage VPERI becomes low to have a very small difference between the peripheral circuit voltage VPERI and the array-system circuit voltage VARY as described above, an ON-resistance of a column switch becomes relatively high and movement of an electric charge via the column switch becomes slow. Therefore, it becomes difficult to write data from an IO line pair to a bit line pair and read data from a bit line pair to an IO line pair.

As for a row-system signal, a word line is started by using a voltage VPP that is higher than the external voltage VDD. However, when the internal operation voltage VPERI becomes lower, the difference between the internal operation voltage VPERI and the voltage VPP becomes larger. Therefore, a level conversion from VPERI to VPP takes time, and thus start of a word line becomes slow.

SUMMARY

In one embodiment, there is provided a semiconductor device comprising: an input buffer that receives an address signal having a first amplitude; a first level shifter that converts an amplitude of the address signal output from the input buffer to a second amplitude that is smaller than the first amplitude; an address controller that receives the address signal output from the first level shifter; an address decoder that generates a decode signal by decoding the address signal output from the address controller; and a second level shifter that converts an amplitude of the address signal output from the address controller or of the decode signal output from the address decoder from the second amplitude to the first amplitude such that at least an amplitude level of the decode signal becomes the first amplitude.

According to the present invention, even when the internal operation voltage VPERI is remarkably lower than the external voltage VDD, a semiconductor device that performs a high-speed data transfer between a bit line pair and a local IO line pair can be provided. Further, according to the present invention, a semiconductor device that performs a rise operation and a fall operation of a word line potential at a high speed can be provided.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

Preferred embodiments of the present invention will be now described below in detail with reference to the accompanying drawings.

Figure 1:
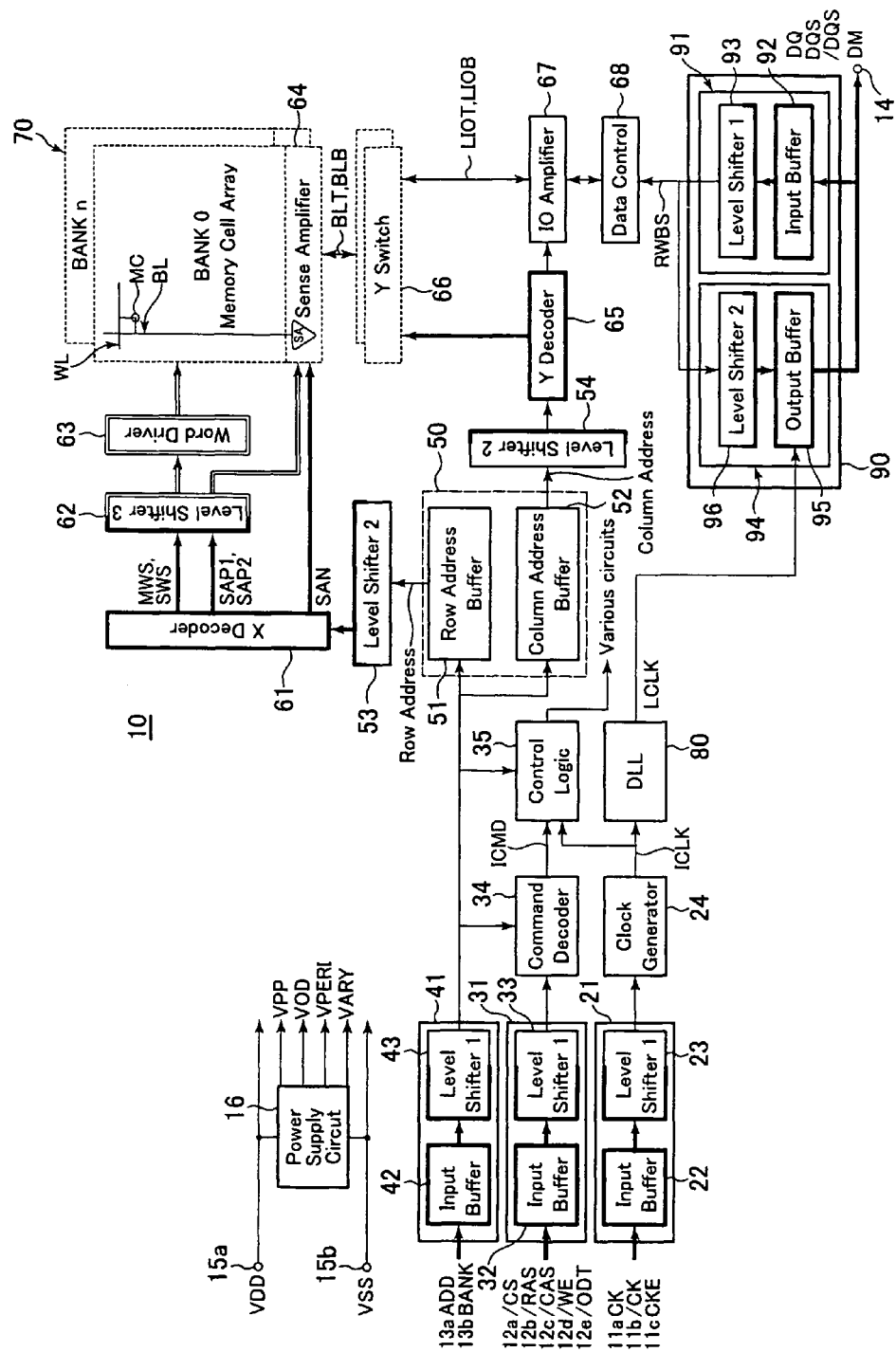
FIG. 1 is a block diagram showing an entire configuration of a semiconductor device according to a first embodiment of the present invention.

FIG. 1 is a block diagram showing an entire configuration of a semiconductor device 10 according to a first embodiment of the present invention.

The semiconductor device 10 according to this embodiment is a DDR SDRAM, and includes, as external terminals, clock terminals 11a and 11b, a clock enable terminal 11c, command terminals 12a to 12e, address terminals 13a and 13b, a data system terminal 14, and power source terminals 15a and 15b. Although not shown in FIG. 1, the semiconductor device 10 also includes other terminals such as a calibration terminal and a reset terminal.

The clock terminals 11a and 11b are supplied with external clock signals CK, /CK, respectively. The clock enable terminal 11c is supplied with a clock enable signal CKE. The external clock signals CK, /CK and the clock enable signal CKE are supplied to a clock input circuit 21. In the present specification, a signal attached with "/" at the head of a signal name means an inversion signal of a corresponding signal or a low active signal. Therefore, the external clock signals CK, /CK are mutually complementary signals.

An output of the clock input circuit 21 is supplied to a clock generation circuit 24. The clock input circuit 21 includes an input buffer 22 and a first level shifter 23. Amplitudes of the external clock signals CK, /CK input to the first level shifter 23 via the input buffer 22 are level-converted from the external voltage VDD to the internal operation voltage VPERI, and the low voltage clock is supplied to a clock generation circuit 24. In the first embodiment, the external voltage VDD is 1.5 V, for example, and the internal operation voltage VPERI is 1.0 V.

The clock generation circuit 24 generates single-phase internal clock signal ICLK based on the external clock signals CK, /CK, and supplies the single-phase internal clock signal ICLK to various internal circuits excluding a data output-system circuit. A DLL circuit 80 generates a phase-controlled internal clock LCLK based on the internal clock signal ICLK, and supplies the internal clock signal ICLK to a data input/output (I/O) circuit 90.

The command terminals 12a to 12e are supplied with a chip select signal /CS, a row-address strobe signal /RAS, a column-address strobe signal /CAS, a write enable signal /WE, and an on-die termination signal ODT, respectively. These signals as command signals CMD are supplied to a command input circuit 31.

The command signals CMD supplied to the command input circuit 31 are supplied to a command decoder 34. The command input circuit 31 includes an input buffer 32 and a first level shifter 33. An amplitude of the command signals CMD input to the first level shifter 33 via the input buffer 32 is level-converted from the external voltage VDD to the internal operation voltage VPERI, and these low-voltage command signals CMD are supplied to the command decoder 34.

The command decoder 34 holds, decodes, and counts command signals, thereby generating various internal commands ICMD. The internal commands ICMD generated are supplied to a control logic 35. The control logic 35 includes a mode register and a refresh controller. The mode register holds various types of operation mode information.

The address terminals 13a and 13b are supplied with an address signal ADD and a bank address signal BANK. The address signal ADD and the bank address signal BANK supplied to the terminals are next supplied to an address input circuit 41.

An output of the address input circuit 41 is supplied to an address controller 50. The address input circuit 41 includes an input buffer 42 and a first level shifter 43. An amplitude of the address signal ADD input to the first level shifter 43 via the input buffer 42 is level-converted from the external voltage VDD to the internal operation voltage VPERI, and the low-voltage command signal CMD is supplied to the address controller 50.

Out of the address signal ADD supplied to the address controller 50, a row address is latched by a row address buffer 51, and a column address is latched by a column address buffer 52. When entered in a mode register set, the address signal ADD is supplied to the mode register within the control logic 35, thereby updating a content of the mode register.

An output of the row address buffer 51 is supplied to a row decoder 61 via a second level shifter 53. An amplitude of a row address signal output from the row address buffer 51 is increased to the voltage VDD by the second level shifter 53.

The row decoder 61 is a circuit that selects a word line WL in a memory cell array 70 according to a row address signal. An output of the row decoder 61 is supplied to a word driver 63. A third level shifter 62 is provided between the row decoder 61 and the word driver 63. An amplitude of a word-line selection signal output from the row decoder 61 is increased to a voltage VPP that is higher than the voltage VDD by the third level shifter 62. Although it is not particularly limited, the VPP is 2.6 V.

When an amplitude of an output signal of the row address buffer 51 is VPERI like a conventional level, the level shifter 62 needs to increase a voltage from VPERI to VPP at once. Therefore, a change from VPERI to VPP becomes slow. However, in the first embodiment, the level shifter 53 once increases an amplitude of an output signal of the row address buffer 51 to VDD, thereby converting an amplitude of a word-line selection signal to VDD. Consequently, the level shifter 62 can convert VDD to VPP at a high speed.

The word driver 63 is a circuit activating one word line WL selected from plural word lines WL within the memory cell array 70. The memory cell array 70 includes dynamic memory cells MC arranged in a matrix. A selection terminal of a memory cell MC is coupled to a word line WL, and a data I/O terminal of the memory cell MC is coupled to a bit line BL intersecting with the word line WL. The bit line BL is connected to a corresponding sense amplifier SA within a sense circuit 64.

An output of the column address buffer 52 is supplied to a column decoder 65 via a second level shifter 54. An amplitude of a column address signal output from the column address buffer 52 is increased to the VDD by the second level shifter 54.

The column decoder 65 selects any one sense amplifier SA within the sense circuit 64 according to a column address signal, thereby selecting a bit line pair BLT and BLB within the memory cell array 70. The bit line pair BLT and BLB selected by the column decoder 65 are connected to an I/O amplifier 67 via a column switch 66 and a local IO line pair LIOT and LIOB. In a read operation, the I/O amplifier 67 amplifies read data once amplified by the sense amplifier SA, and supplies the amplified read data to the data I/O circuit 90 via a data control circuit 68 and a read/write bus RWBS. On the other hand, in a write operation, the I/O amplifier 67 amplifies write data supplied from the data I/O circuit 90 via the read/write bus RWBS, and supplies the amplified write data to the sense amplifier SA.

The data system terminal 14 includes a terminal to output read data DQ and input write data DQ, a terminal to input and output data strobe signals DQS, /DQS, and a terminal to input and output a data mask signal, and is connected to the data I/O circuit 90. As shown in FIG. 1, the data I/O circuit 90 includes a data input circuit 91 and a data output circuit 94. The data input circuit 91 includes an input buffer 92 and a first level shifter 93. The data output circuit 94 includes an input buffer 95 and a second level shifter 96. The first level shifter 93 is provided to reduce the amplitude of the external signal to VPERI. The second level shifter 96 is provided to increase the amplitude VPERI of an internal signal to VDD.

The data I/O circuit 90 is connected to the read/write bus RWBS. The read/write bus RWBS is connected to the local IO line pair LIOT and LIOB via the data control circuit 68, and the I/O amplifier 67. The local IO line pair LIOT and LIOB are connected to the column switch 66.

The power source terminals 15a and 15b are supplied with the power source potentials VDD and VSS, respectively. The power source potentials VDD and VSS are supplied to various internal circuits, and are also supplied to an internal-voltage generation circuit 16. The internal-voltage generation circuit 16 generates internal power source potentials VPP, VOD, VPERI, and VARY based on the power source potentials VDD and VSS. These potentials have a size relationship of VPP>VDD>VOD>VPERI≅VARY>VSS. In the present specification, symbols which are the same as those of these potential are sometimes used for a potential difference (a voltage) between the power source potential VSS and each potential. For example, the voltage VPP indicates a potential difference between the power source potential VSS and the internal potential VPP.

In FIG. 1, a thick line block indicates a circuit that handles the voltage VDD, and a normal line block indicates a circuit that handles the voltage VPERI. A double line block indicates a circuit that handles the voltage VPP, and a broken line block indicates a circuit that handles the voltage VARY. A level shifter is drawn by two lines of different thicknesses indicating a voltage handled at an input side and a voltage handed at an output side, respectively.

Figure 2:
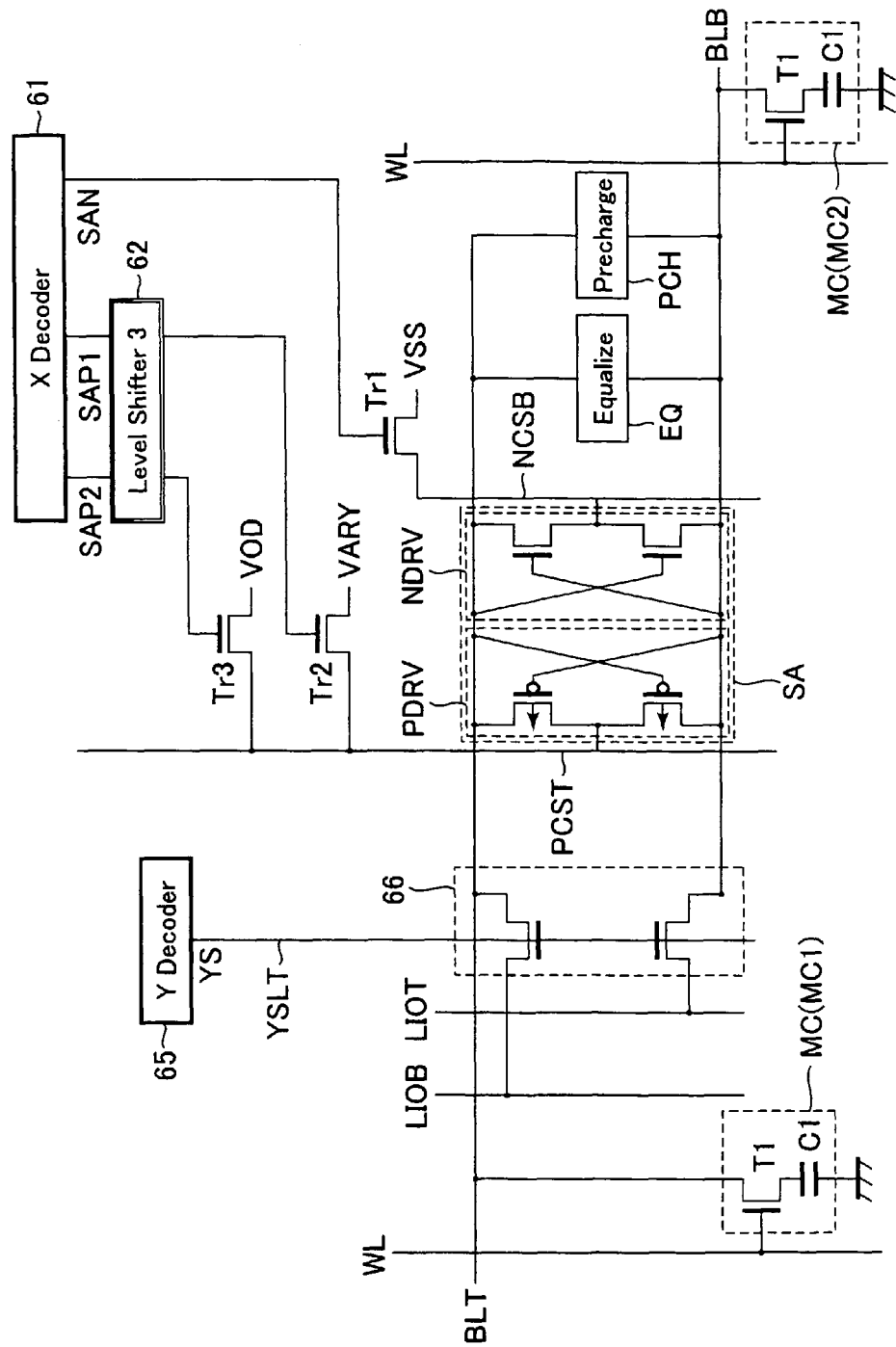
FIG. 2 is a circuit diagram showing a circuit configuration of the sense amplifier and its periphery.

FIG. 2 is a circuit diagram showing a circuit configuration of the sense amplifier SA and its periphery.

As shown in FIG. 2, the memory cell MC includes a cell transistor (an access transistor) T1 and a cell capacitor C1, and is provided at an intersection between one of complementary bit lines BLT and BLB and a word line WL. A memory cell MC1 in FIG. 2 is connected to the bit line BLT, and the other memory cell MC2 is connected to the bit line BLB. A gate of the cell transistor T1 is connected to the word line WL, and a drain of the cell transistor T1 is connected to the bit line BLT or BLB.

The memory cell MC includes the cell transistor T1 of which a drain is connected to the bit line BLB, and the cell capacitor C1 of which one electrode is connected to a source of the cell transistor T1 and the other electrode is connected to the ground potential VSS. The column switch 66, the sense amplifier SA, an equalize circuit EQ, and a precharge circuit PCH are connected to the bit line pair BLT and BLB to which the memory cell MC is connected.

The sense amplifier SA has a flip-flop configuration including an NMOS cross-coupled circuit (pull-down circuit) NDRV, and a PMOS cross-coupled circuit (pull-up circuit) PDRV. The NMOS cross-coupled circuit NDRV is connected to an NMOS-side common-source control line NCSB, and the PMOS cross-coupled circuit PDRV is connected to a PMOS-side common-source control line PCST.

The common-source control line NCSB is connected to the power source potential VSS via an N-channel transistor Tr1, and a gate of the transistor Tr1 is connected to the row decoder 61. When an NMOS activation signal SAN output from the row decoder 61 becomes at a high level VDD, the transistor Tr1 is turned ON, and the common-source control line NCSB changes to VSS. In this case, because an amplitude of the NMOS activation signal SAN output from the row decoder 61 is not VPERI but VDD, an ON-resistance of the transistor Tr1 can be reduced, and the NMOS cross-coupled circuit NDRV of the sense amplifier SA can be activated at a high speed.

The common-source control line PCST is connected to the power source potential VARY via an N-channel transistor Tr2, and a gate of the transistor Tr2 is connected to the row decoder 61 via the level shifter 62. Although not particularly limited thereto, the array-system circuit voltage VARY is 1.0 V, for example, and is equal to the peripheral circuit voltage VPERI. When a PMOS activation signal SAP1 output from the row decoder 61 becomes at a high level, the transistor Tr2 is turned ON, and a potential of the common-source control line PCST becomes VARY, thereby activating the PMOS cross-coupled circuit PDRV of the sense amplifier SA.

The common-source control line PCST is also connected to a power source potential VOD via an N-channel transistor Tr3, and a gate of the transistor Tr3 is connected to the row decoder 61 via the level shifter 62. The N-channel transistor Tr3 is an overdrive circuit to activate the PMOS cross-coupled circuit PDRV at a high speed. Therefore, the overdrive voltage VOD is set at a voltage slightly higher than VARY. The transistor Tr3 is turned ON at the same time as Tr2 or slightly earlier. A potential of the common-source control line POST becomes the potential VOD that is higher than VARY, thereby activating the PMOS cross-coupled circuit PDRV of the sense amplifier SA at a high speed. After the PMOS cross-coupled circuit PDRV is activated, the transistor Tr3 is turned OFF, and only the transistor Tr2 is turned ON. Therefore, a potential of the common-source control line PCST is maintained at VARY.

When amplitudes of PMOS activation signals SAP1 and SAP2 output from the row decoder 61 are VPERI, a conversion from VPERI to VPP by the level shifter 62 becomes slow because of a large potential difference between VPERI and VPP, and start of the common-source control line POST becomes slow. However, when amplitudes of the PMOS activation signals SAP1 and SAP2 output from the row decoder 61 are VDD like in the first embodiment, a conversion from VDD to VPP by the level shifter 62 becomes fast because of a small potential difference between VDD and VPP, and the common-source control line POST can be activated at a high speed.

When NMOS activation signals SAP1 and SAP2 output from the row decoder 61 are input directly to Tr2 and Tr3 without being level-shifted to VPP, the transistor Tr2 and Tr3 cannot be started at a high speed and activation of the NMOS cross-coupled circuit NDRV becomes slow because voltages applied to gates of the transistors Tr2 and Tr3 are low. However, voltages of the NMOS activation signals SAP1 and SAP2 output from the row decoder 61 are increased by the level shifter 62, and are the voltage VPP which are higher than VDD. Therefore, ON-resistances of the transistors Tr2 and Tr3 can be reduced, and the PMOS cross-coupled circuit PDRV of the sense amplifier SA can be activated at a high speed.

The column switch 66 is connected to the column decoder 65 via a column selection line YSLT. An amplitude of a column selection signal YS from the column decoder 65 is DVV. The column selection signal YS is supplied to gates of N-channel transistors Tr4 and Tr5 of the column switch 66. As a result, the column switch 66 is turned ON, and the bit line pair BLT and BLB are connected to the local IO line pair LIOB and LIOT, respectively.

When an amplitude of the column selection signal YS output from the column decoder 65 is VPERI, a potential difference between the amplitude VARY of the bit line pair BLT and BLB and the amplitude VPERI of the local IO line pair LIOB and LIOT becomes very small, and a resistance of the column switch 66 becomes relatively large. Therefore, the moving speed of an electric charge having passed through the column switch 66 becomes slow. Consequently, it becomes difficult to write data from the local IO line pair LIOT and LIOB to the bit line pair BLT and BLB, or read data from the bit line pair BLT and BLB to the local IO line pair LIOT and LIOB.

However, in the first embodiment, because an amplitude of the column selection signal YS output from the column decoder 65 is VDD and because the ON-resistance of a transistor of the column switch is reduced, the resistance of the column switch becomes relatively small, and the movement of an electric charge having passed through the column switch 66 becomes fast. Therefore, writing of data from the local IO line pair LIOT and LIOB to the bit line pair BLT and BLB, or reading of data from the bit line pair BLT and BLB to the local IO line pair LIOT and LIOB can be securely performed.

Figure 3:
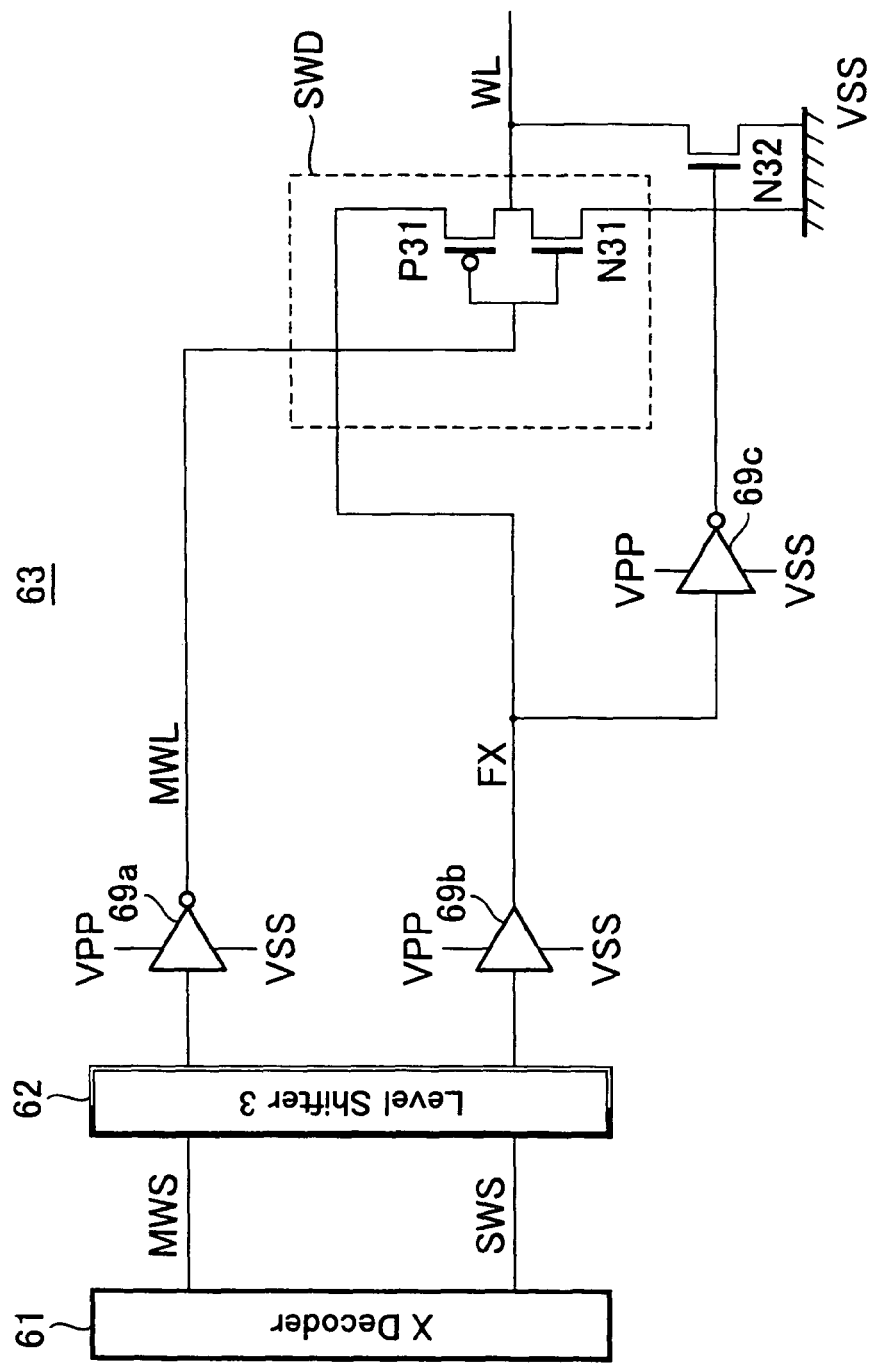
FIG. 3 is a circuit diagram showing a configuration example of the word driver.

FIG. 3 is a circuit diagram showing a configuration example of the word driver 63.

As shown in FIG. 3, the word driver 63 according to the first embodiment is connected to the row decoder 61 via the level shifter 62. The word driver 63 includes a driver 69a that drives a main word line MWL, a driver 69b that drives a sub-word selection line FX, a P-channel transistor P31, and an N-channel transistor N31. The word driver 63 further includes a driver SWD that drives a word line WL, and an N-channel transistor N32 and a driver 69c that resets the word line WL. The drivers 69a and 69c are an inverting output type, and the driver 69b is a non-inverting output type.

The amplitude VDD of a main word-line selection signal MWS and a sub-word-line selection signal SWS output from the row decoder 61 is increased to the amplitude VPP by the level shifter 62, and thereafter, the selection signals are supplied to the main word line MWL and the sub-word selection line FX, respectively. The main word line MWL is connected to a control terminal of the driver SWD via the driver 69a, and the sub-word selection line FX is connected to a power source terminal of the driver SWD via the driver 69b.

When the sub-word-line selection signal SWS output from the row decoder 61 is at a high level (VDD), the driver SWD becomes active, and a potential (a logic level) of a corresponding word line WL becomes the same as a potential of the main word line MWL. That is, when the main word-line selection signal is at a high level (VPP), a potential of the word line WL becomes VPP. When the sub-word-line selection signal is at a low level (VSS), a potential of the word line WL becomes VSS.

When the sub-word-line selection signal SWS output from the row decoder 61 is at a low level (VSS), the driver SWD becomes inactive, and the N-channel transistor N32 is turned ON. Therefore, a potential of a corresponding word line WL becomes always VSS.

As described above, the word line WL becomes at a high level (VPP) when both the main word-line selection signal MWS and the sub-word-line selection signal SWS output from the row decoder 61 are at a high level (VPP). When at least one of the selection signals is at a low level (VSS), the word line WL becomes at a low level (VSS).

When both amplitudes of the main word-line selection signal MWS and the sub-word-line selection signal SWS output from the row decoder 61 are VPERI, a conversion from VPERI to VPP by the level shifter 62 becomes slow due to a large potential difference between VPERI and VPP, and therefore start of the word line WL becomes slow. However, when amplitudes of the main word-line selection signal MWS and the sub-word-line selection signal SWS output from the row decoder 61 are VDD like in the first embodiment, a conversion from VDD to VPP by the level shifter 62 becomes fast because of a small potential difference between VDD and VPP, and the word line WL can be activated at a high speed.

Figure 4:
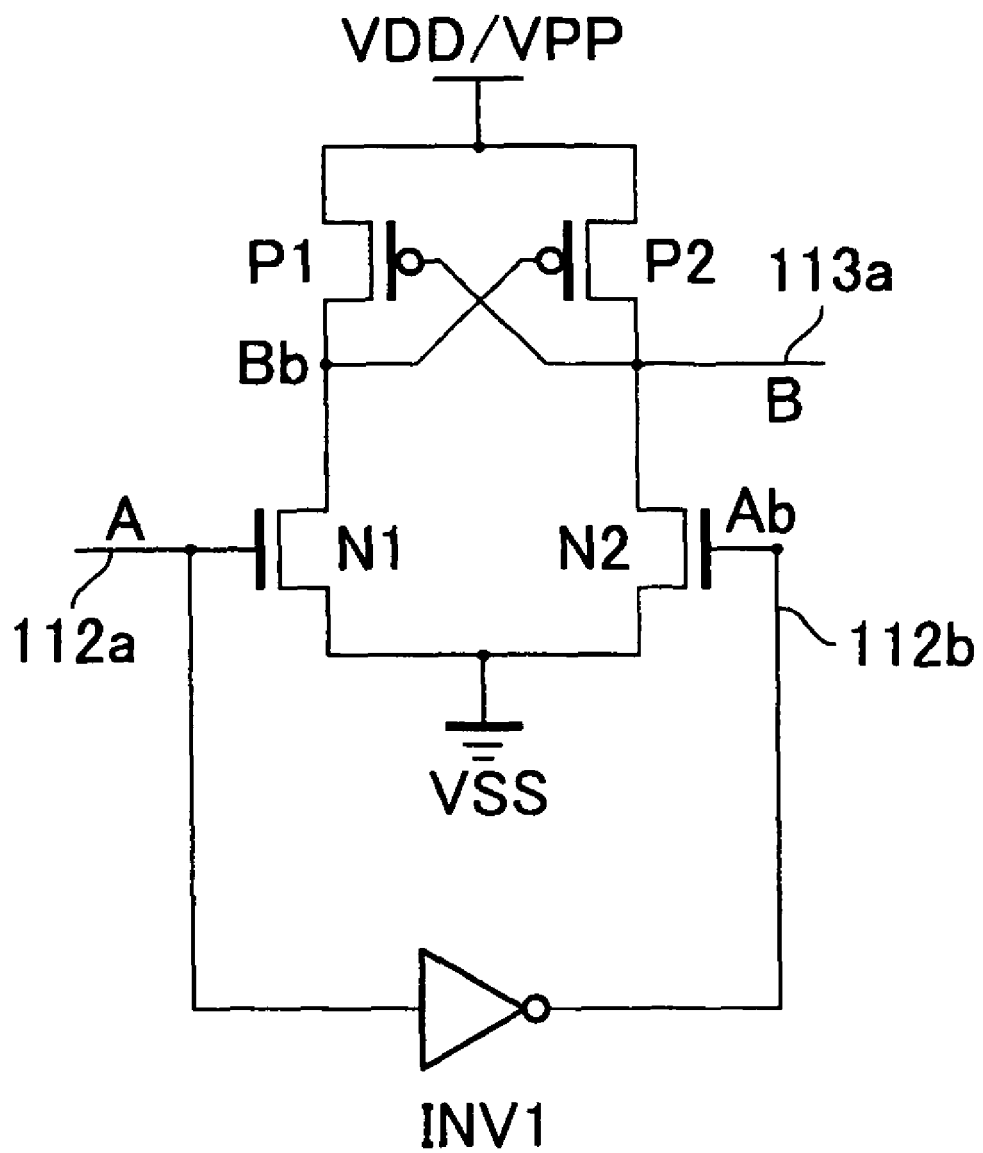
FIG. 4 is a circuit diagram showing a configuration of a level shifter according to the first embodiment.

FIG. 4 is a circuit diagram showing a configuration of a level shifter 100 according to the first embodiment. The level shifter 100 is preferably used as the level shifters 53 and 62 of a row system shown in FIG. 1.

As shown in FIG. 4, the level shifter 100 converts an input signal to a signal of a predetermined amplitude level, and includes a pair of P-channel transistors P1 and P2, a pair of N-channel transistors N1 and N2, and an inverter INV1.

The pair of transistors P1 and P2 constitutes a cross-coupled latch circuit connected to each other in a flip-flop manner. A drain of the transistor P1 is connected to a gate of the transistor P2, and a drain of the transistor P2 is connected to a gate of the transistor P1. Sources of the transistors P1 and P2 are connected to the power source line. The power source line is supplied with the power potential VDD in the case where the level shifter 100 used as the level shifter 53. The power source line is supplied with the internal power potential VPP in the case where the level shifter 100 used as the level shifter 62.

The pair of transistors N1 and N2 constitute a differential circuit. A drain of the transistor N1 is connected to the drain of the transistor P1, and a drain of the transistor N2 is connected to the drain of the transistor P2. Sources of the transistors N1 and N2 are connected to the ground potential VSS.

An input terminal 112a of the level shifter 100 is connected to a gate of the transistor N1, and the gate is supplied with an input signal A having an amplitude level based on the internal operation voltage VPERI from the input terminal 112a. The input terminal 112a is connected to the gate of the transistor N2 via an inverter INV1. That is, an inverting input terminal 112b is connected to the gate of the transistor N2, and an inverting input signal Ab having a complementary relationship with the input signal A is supplied to the gate.

An output terminal 113a of the level shifter 100 is connected to the drain of the transistor P2 (the drain of the transistor N2), and an output signal B that is level-shifted to VDD is extracted from the output terminal 113a. An inverting output signal Bb having a complementary relationship with the output signal B can be extracted from the drain of the transistor P1 (the drain of the transistor N1).

Figure 5:
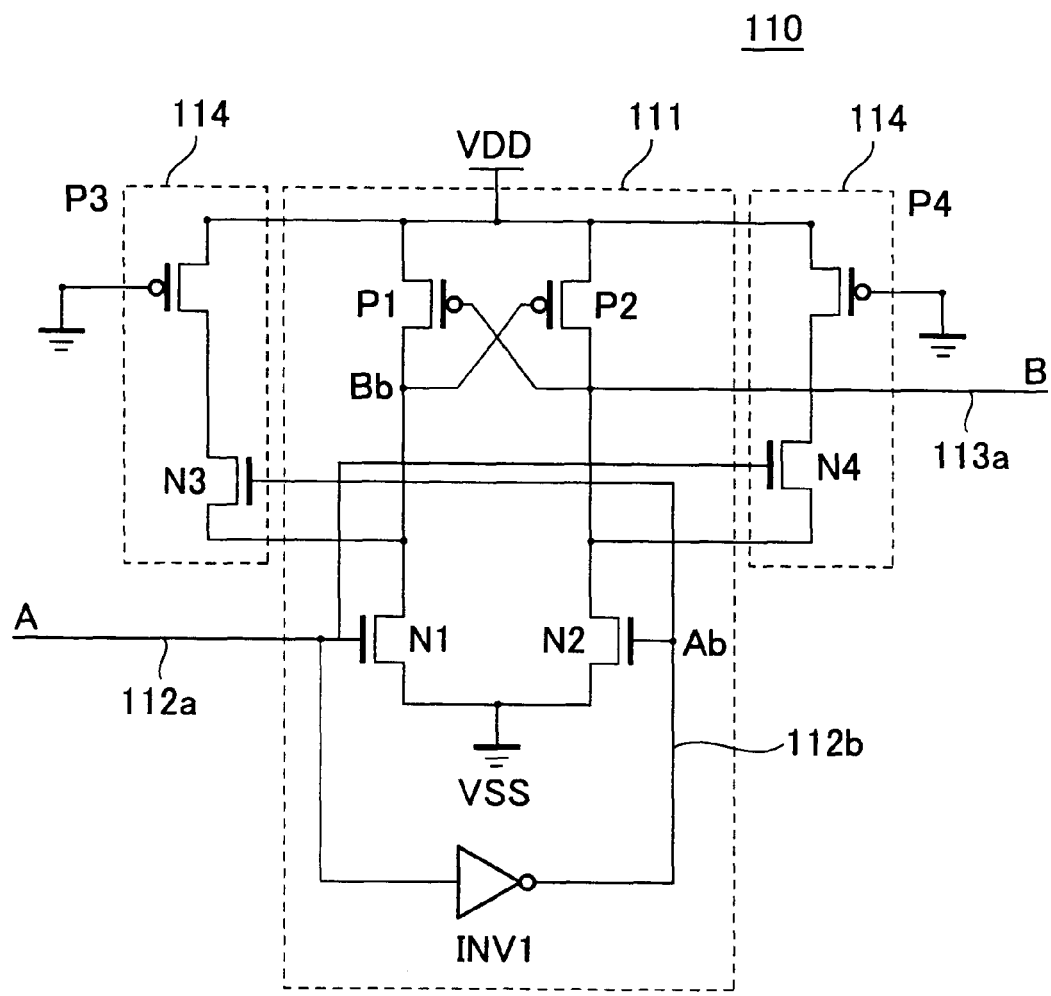
FIG. 5 is a circuit diagram showing a configuration of a level shifter according to a second embodiment of the present invention.

FIG. 5 is a circuit diagram showing a configuration of a level shifter 110 according to a second embodiment of the present invention. The level shifter 110 is preferably used for the level shifter 54 of a column system or the level shifter 96 of a data I/O circuit 90 shown in FIG. 1.

The level shifter 110 according to the second embodiment has a current supply circuit 114 added to a level-shifter core circuit 111 having a circuit configuration shown in FIG. 4.

The current supply circuit 114 includes a pair of P-channel transistors P3 and P4, and a pair of N-channel transistors N3 and N4. The transistors N3 and N4 have a function of preventing aggravation of a change rate of output duty due to a shortage of driving capacity of the P-channel transistors P1 and P2, and the transistors P3 and P4 have a function of suppressing supply of a large current to the transistors N3 and N4.

A series circuit of the transistor P3 and the transistor N3 is inserted into between the power source VDD and the drain of the transistor N1 (the drain of the transistor P1), and is connected in parallel to the transistor P1. Similarly, a series circuit of the transistor P4 and the transistor N4 is inserted into between the power source VDD and the drain of the transistor N1 (the drain of the transistor P1), and is connected in parallel to the transistor P2. Sources of the P-channel transistors P3 and P4 are connected to the power source VDD, and gates of these transistors are clamped at an ON potential (a ground potential). A drain of the transistor N3 is connected to a drain of the transistor P3, and a drain of the transistor N4 is connected to a drain of the transistor P4. A gate of the transistor N3 is supplied with the inverting input signal Ab, and a gate of the transistor N4 is supplied with the input signal A.

Although the level shifter 110 according to the second embodiment has a series circuit of the N-channel transistors N3 and N1, the transistor N3 is not directly connected to the power source VDD, and the P-channel transistor P3 is present between the transistor N3 and the power source VDD. Although the level shifter 110 has a series circuit of the N-channel transistors N4 and N2, the transistor N4 is not directly connected to the power source VDD, and the P-channel transistor P4 is present between the transistor N4 and the power source VDD.

When the P-channel transistors P3 and P4 as current limit elements are inserted into between the power source VDD and the N-channel transistors N3 and N4, respectively in this manner, a large current that becomes a cause of breakdown of a transistor flows to a position of a lower resistance, and a flow of a large current to the N-channel transistors N3 and N4 can be suppressed, even when a large surge is superimposed on the power source VDD.

In the case of a conventional level shifter configured by only the level-shifter core circuit 111, a change rate of a duty of the output signal B to the input signal A is aggravated when VDD becomes low. This aggravation occurs because a driving capacity of the P-channel transistors P1 and P2 becomes small when the voltage VDD becomes low and because a difference (T1−T2) becomes large, where T1 is time required for a potential level of the output signal B to change from VSS to VDD, and T2 is time required for the potential level to change from VDD to VSS. However, when the current supply circuit 114 is provided in the level-shifter core circuit 111, a shortage of a driving capacity of the P-channel transistors P1 and P2 is compensated for by the N-channel transistors N3 and N4. Therefore, aggravation of the output duty can be prevented.

Figure 6:
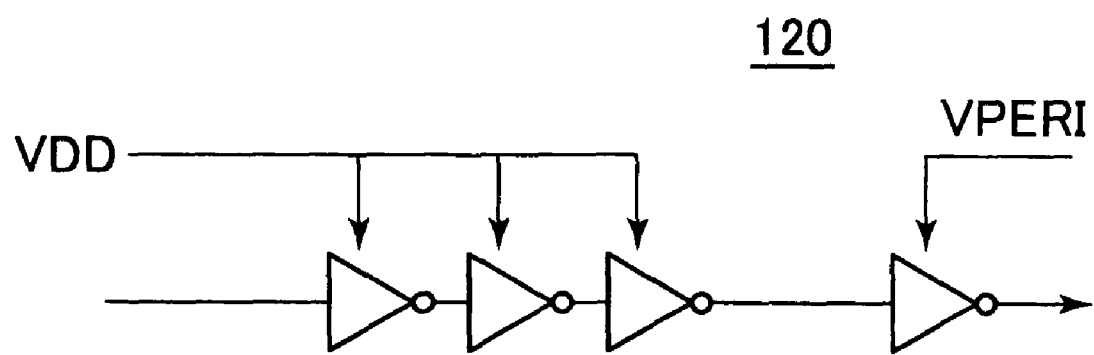
FIG. 6 is a circuit diagram showing a configuration of a level shifter according to a third embodiment of the present invention.

FIG. 6 is a circuit diagram showing a configuration of a level shifter 120 according to a third embodiment of the present invention. The level shifter 120 is used to reduce a voltage, and is preferably used for the level shifters 23, 33, 43, and 93 shown in FIG. 1.

As shown in FIG. 6, the level shifter 120 includes buffers 121 to 124 connected in series at four stages. The voltage VDD is supplied to power source terminals of first to third buffers 121 to 123, and VPERI is supplied to a power source terminal of the fourth buffer 124. In this manner, the level shifter 120 to reduce a voltage can be configured by a multistage connection.

Figure 7:
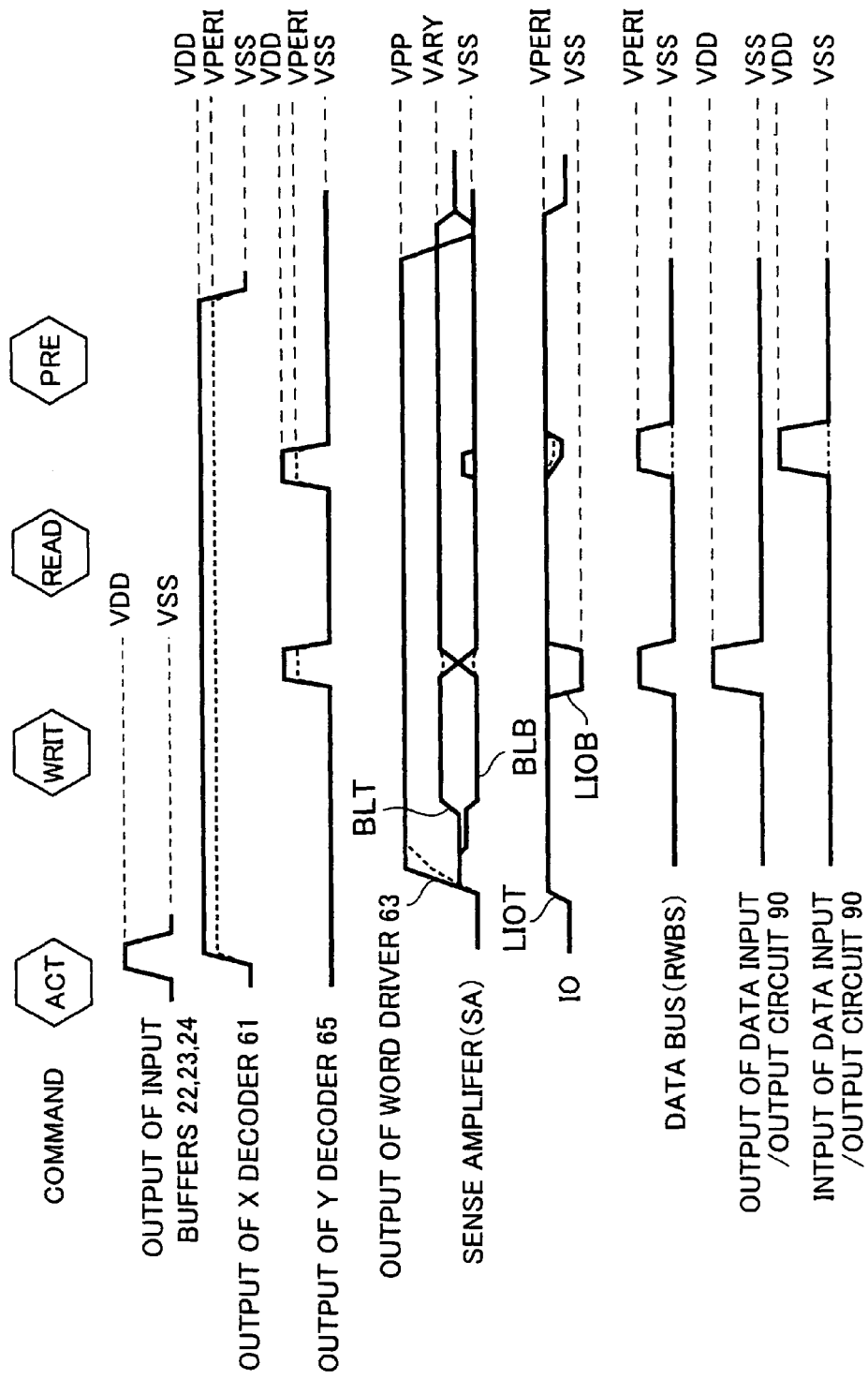
FIG. 7 is a signal waveform diagram for explaining an operation of the semiconductor device.

FIG. 7 is a signal waveform diagram for explaining an operation of the semiconductor device 10. This signal waveform diagram explains an amplitude of each signal, and schematically shows read/write timings. Broken lines in FIG. 7 indicate signal waveforms showing an operation of a conventional semiconductor device.

As shown in FIG. 7, an external signal of the amplitude VDD is supplied to the clock input circuit 21, the command input circuit 31, and the address input circuit 41. Therefore, an amplitude of an output signal of each of the input buffers 22, 32, and 42 becomes VDD, but the amplitude becomes VPERI after passing through the level shifters 23, 33, and 43.

When a row address is input together with an active command ACT, the row decoder 61 decodes the row address, and outputs a word-line selection signal. Because an amplitude of an output signal of the row decoder 61 is VDD, a voltage of the word-line selection signal can be increased to a high potential VPP at a high speed. Broken lines indicate output-signal waveforms of a conventional word driver. When an amplitude of the output signal of the row decoder 61 is VPERI, it takes time to increase a voltage from VPERI to VPP. Therefore, it is clear that a signal rise from VSS to VPP is slow.

A word line WL corresponding to a row address is then selected by a word-line selection signal. In this case, one word line (for example, WL1 in FIG. 2) connected to one memory cell is activated, as a selected word line WL, and voltage shifts from a waiting level VSS to a selection level VPP. In the memory cell MC, the cell transistor TR1 is turned ON, the cell capacitor C1 is connected to the bit line BLT, and data of the memory cell MC1 is read to the bit line BLT. When data of "H" is stored in the memory cell MC, a potential of the bit line BLT becomes higher than a precharge level VARY/2 by an electric charge accumulated in the cell capacitor C1.

After a lapse of a predetermined period since the word line WL is activated, an NMOS sense-amplifier activation signal SAN shifts from the ground potential VSS in a non-selection state to a word-line boosted voltage VPP in an activation state, and the NMOS cross-coupled circuit NDRV of the sense amplifier SA is activated. A PMOS sense-amplifier activation signal SAP shifts from the word-line increased potential VPP in a non-selection state to the ground potential VSS in an activation state substantially simultaneously with SAN or in a slight delay, and the PMOS cross-coupled circuit NDRV of the sense amplifier SA is activated. Accordingly, a fine potential difference generated between the bit line pair BLT and BLB is amplified to VARY. A column command input is awaited in this state. An actual column command can be input simultaneously with a bit line amplitude that becomes a sufficient amplitude or before this timing.

When a write command WRIT is input from the outside, a column address of a memory cell MC into which data is desired to be written simultaneously with the write command WRIT is input. Write data is input as a signal of the amplitude VDD from a data I/O terminal DQ, is then converted to VPERI by the level shifter 93, and is transferred to the local IO lines LIOT and LIOB via the data control circuit 68 and the I/O amplifier 67. In this case, a potential difference occurs between the local IO lines LIOT and LIOB, an amplitude of the local IO line LIOT becomes VPERI, and an amplitude of the local IO line LIOB becomes VSS. The data transferred is written into a sense amplifier SA connected to a writing cell by the column selection signal YS selected according to a column address input together with the write command WRIT.

In the sense amplifier SA, the bit line pair BLT and BLB are driven according to the data written from the local IO line pair LIOT and LIOB, and the data is written into the cell capacitor C1 of the memory cell MC. Because an amplitude of the output signal of the column decoder 65 is increased to VDD at this time, a resistance of the column switch 66 becomes relatively small, and the movement of an electric charge having passed through the column switch 66 becomes fast. Therefore, the write data can be securely transferred from the local IO line pair LIOT and LIOB to the bit line pair BLT and BLB. Broken lines indicate signal waveforms of a conventional bit line pair BLT and BLB. When an amplitude of an output signal of the column decoder 65 is VPERI, the movement of an electric charge having passed through the column switch 66 is slow. Therefore, it is clear that a potential difference between the local IO line pair LIOT and LIOB is not sufficiently reflected to the bit line pair BLT and BLB.

When a read command READ is input from the outside, a column address of a memory cell MC from which data is desired to be read simultaneously with the read command READ is input. The column selection signal YS from the column decoder 65 shifts from a ground potential VSS in the waiting state to a high potential VDD (not VPERI) in the selection state, and becomes in an activation state, according to a column address input simultaneously with the read command READ. Accordingly, data held in the sense amplifier SA is transferred to the local IO line pair LIOT and LIOB.

Because an amplitude of the output signal of the column decoder 65 is increased to VDD at this time, a resistance of the column switch 66 becomes relatively small, and the movement of an electric charge having passed through the column switch 66 becomes fast. Therefore, the read data can be securely read from the bit line pair BLT and BLB to the local IO line pair LIOT and LIOB. Broken lines indicate signal waveforms of the conventional bit line pair BLT and BLB. When an amplitude of an output signal of the column decoder 65 is VPERI, the movement of an electric charge having passed through the column switch 66 is slow. Therefore, it is clear that a potential difference between the bit line pair BLT and BLB is not sufficiently reflected as a potential difference between the local IO line pair LIOT and LIOB.

Thereafter, the data transferred to the local IO line pair LIOT and LIOB is amplified by the I/O amplifier 67, and a voltage is increased to VDD by the level shifter 96. The data is output from the data I/O terminal DQ.

Figure 8:
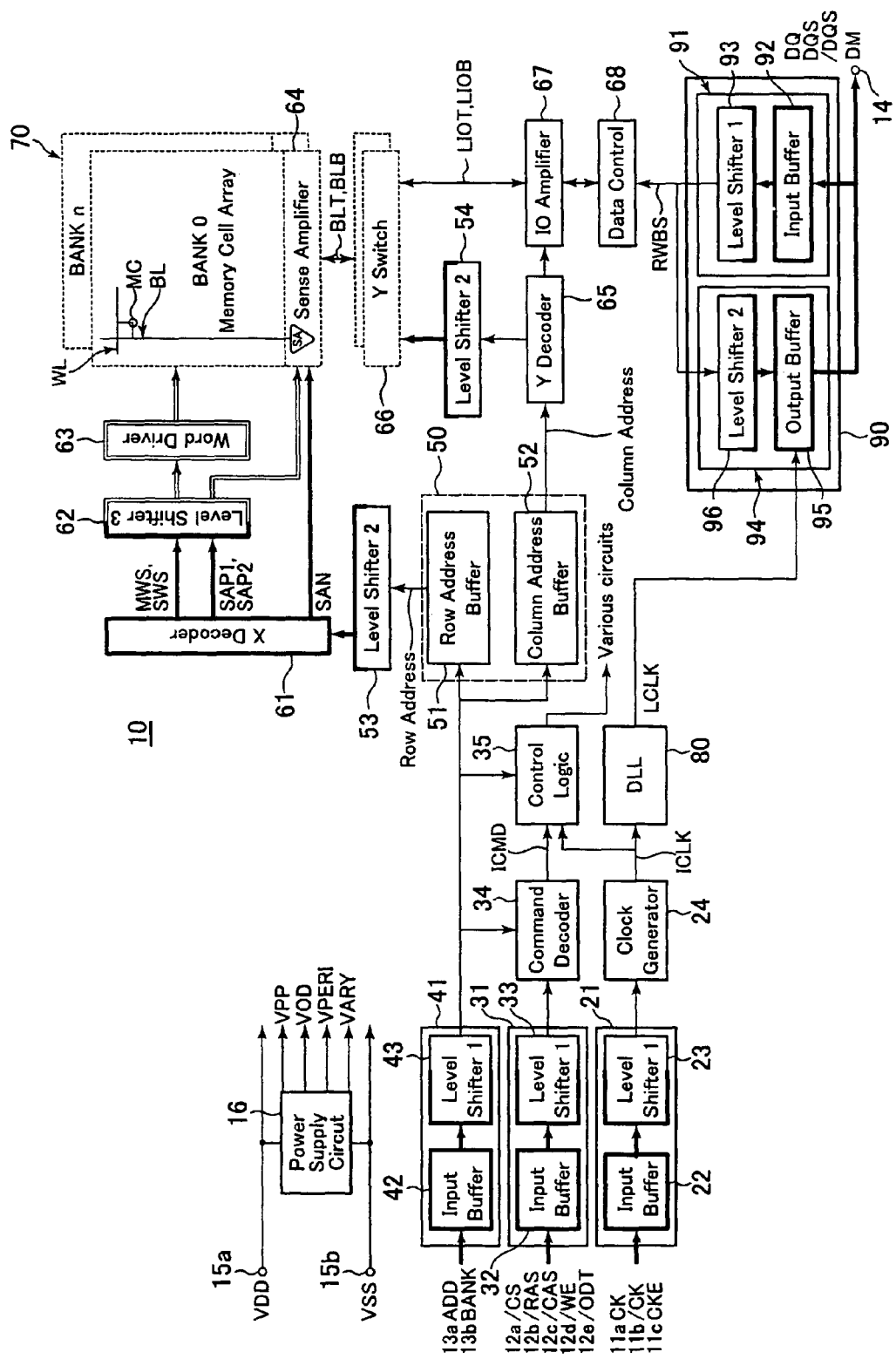
FIG. 8 is a block diagram showing an entire configuration of a semiconductor device according to the second embodiment.

FIG. 8 is a block diagram showing an entire configuration of a semiconductor device 11 according to the second embodiment.

As shown in FIG. 8, the semiconductor device 11 according to the second embodiment has a characteristic such that the level shifter 54 of a column system is provided at a latter stage of the column decoder 65. Although the level shifter 54 is provided between the column address buffer 52 and the column decoder 65 in the configuration shown in FIG. 1, an output of the column decoder 65 can be also level-shifted to VDD like in the second embodiment. An amplitude of a column selection signal becomes VDD in this configuration as well. Therefore, the ON-resistance of a transistor of a column switch can be reduced. Consequently, a resistance of the column switch becomes relatively small, and an electric charge having passed through the column switch 66 becomes fast. As a result, data can be securely written from the local IO line pair LIOT and LIOB to the bit line pair BLT and BLB, and data can be securely read from the bit line pair BLT and BLB to the local IO line pair LIOT and LIOB, in a similar manner to that of the semiconductor device 10 according to the first embodiment.

Figure 9:
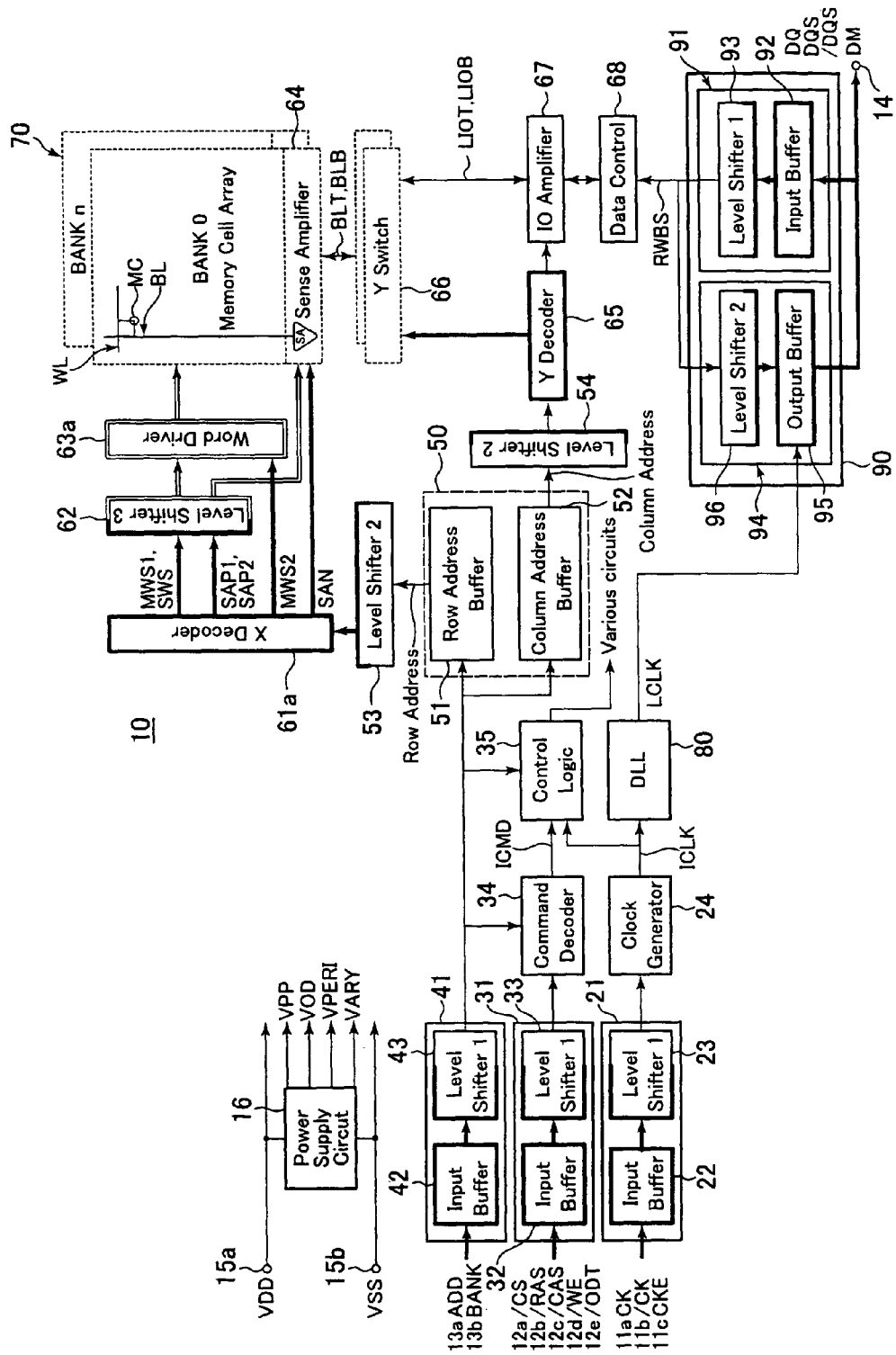
FIG. 9 is a block diagram showing an entire configuration of a semiconductor device according to the third embodiment.

FIG. 9 is a block diagram showing an entire configuration of a semiconductor device 12 according to the third embodiment.

As shown in FIG. 9, the semiconductor device 12 according to the third embodiment has a characteristic such that a signal of the amplitude VDD output from a row decoder 61a is supplied to the word driver 63 as well as to the sense circuit 64. The row decoder 61a outputs a main word-line selection signal of the amplitude VDD, and generates a main word-line selection signal MWS1 of which voltage is increased to the amplitude VPP by the level shifter 62, and a main word-line selection signal MWS2 of the amplitude VDD not to pass through the level shifter 62. The main word-line selection signals MWS1 and MWS2 are supplied to a word driver 63a. Other configurations of the semiconductor device 12 are identical to those of the semiconductor device 10 according to the first embodiment, and therefore like reference characters are denoted to like constituent elements, and detailed explanations thereof will be omitted.

Figure 10:
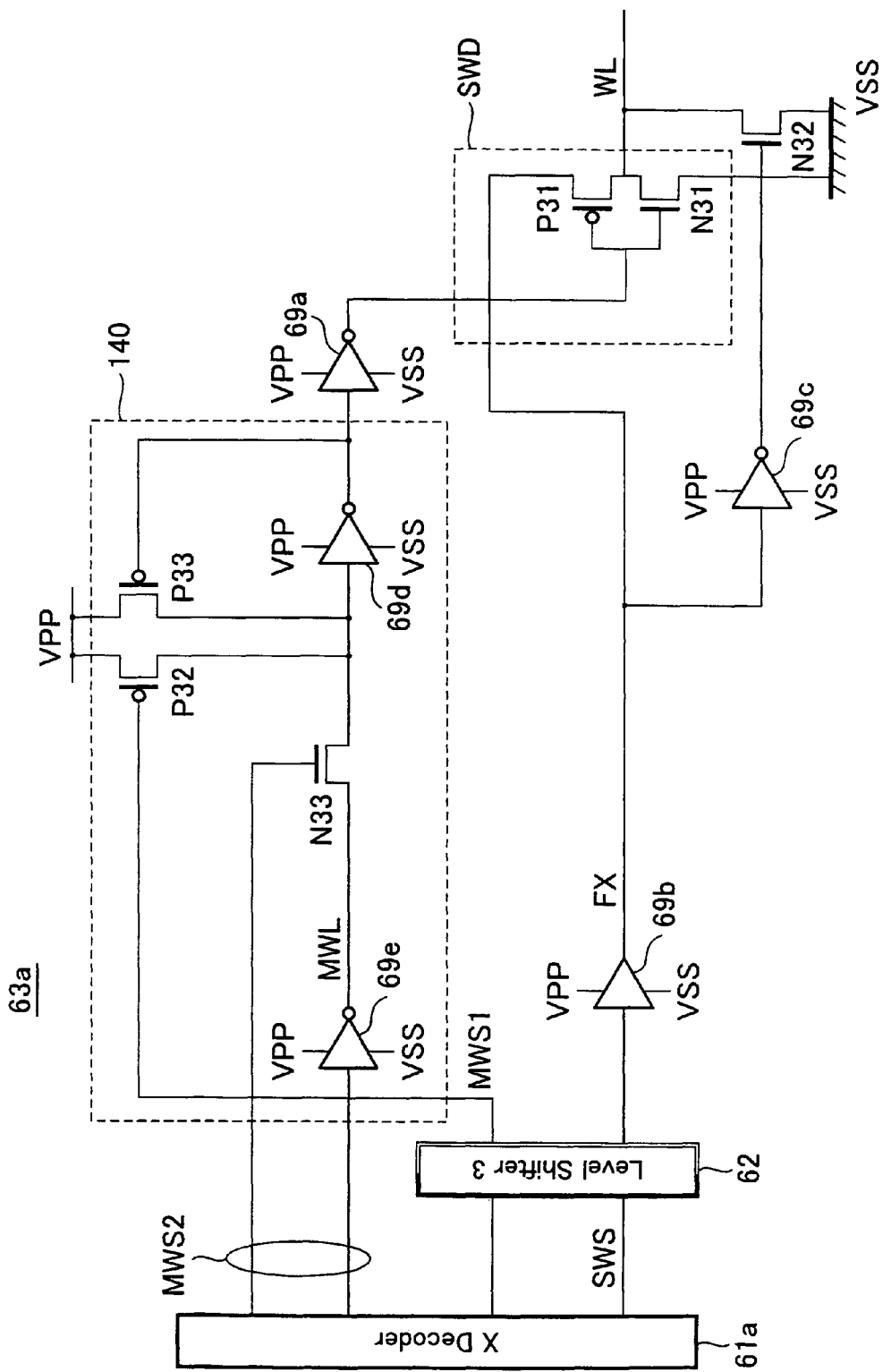
FIG. 10 is a circuit diagram showing a configuration of the word driver.

FIG. 10 is a circuit diagram showing a configuration of the word driver 63a.

As shown in FIG. 10, the word driver 63a according to the third embodiment has a characteristic such that a high-speed drive circuit 140 that increases a rising speed and a falling speed of the word line WL is also included. For the main word-line selection signals MWS output from the row decoder 61a, there are the main word-line selection signal MWS1 of which voltage is increased to the amplitude VPP by the level shifter 62, and the main word-line selection signal MWS2 of the amplitude VDD not passed through the level shifter 62. These signals MWS1 and MWS2 are supplied to the high-speed drive circuit 140. An output terminal of the high-speed drive circuit 140 is connected to an input terminal of the driver SWD that drives the word line WL via the driver 69a. Other configurations of the word driver 63a according to the third embodiment are substantially identical to those of the word driver 63a shown in FIG. 3, and therefore like reference characters are denoted to like constituent elements, and detailed explanations thereof will be omitted.

The high-speed drive circuit 140 includes drivers 69d and 69e connected in series, P-channel transistors P32 and P33 that pull up an input terminal of an driver 69d to the boosted voltage VPP, and an N-channel transistor N33 inserted into between the drivers 69e and 69d. The main word-line selection signal MWS2 of the amplitude VDD output from the row decoder 61a is supplied to the driver 69e and the N-channel transistor N33, and the main word-line selection signal MWS1 of the amplitude VPP is supplied to a gate of the P-channel transistor P32. A gate of the P-channel transistor P33 is connected to an output terminal of the driver 69d (an input terminal of the driver 69a). Drains of the P-channel transistors P32 and P33 are connected to the boosted voltage VPP, and sources of these transistors are connected to an input terminal of the driver 69d (the source of the transistor N33).

When the main word-line selection signals MWS1 and MWS2 output from the row decoder 61a are at a high level, the transistor N33 is turned ON, and the transistor P32 is turned OFF. Therefore, an output signal of the driver 69e at a first stage is supplied to the driver 69d at a second stage. Because the output signal of the driver 69e becomes at a low level, the output signal of the driver 69d becomes at a high level, the transistor P33 is turned OFF, and the output signal of the driver 69a becomes at a low level.

On the other hand, when the main word-line selection signals MWS1 and MWS2 output from the row decoder 61a are at a low level, the transistor N33 is turned OFF, and the transistor P32 is turned ON. Therefore, an output signal of the driver 69e at the first stage is not supplied to the driver 69d at the second stage. Instead, because the P-channel transistor P32 is turned OFF and because a potential of an input terminal of the driver 69d becomes at a high level VPP, an output signal of the driver 69d becomes at a low level, the transistor P33 is turned ON, and an output signal of the driver 69a becomes at a high level.

When both the main word-line selection signals MWS1 and MWS2 and the sub-word-line selection signal SWS output from the row decoder 61a are at a high level (VPP), the Word line WL becomes at a high level (VPP). When at least either the main word-line selection signals MWS1 and MWS2 or the sub-word-line selection signal SWS is at a low level (VSS), the word line WL becomes at a low level (VSS).

In this manner, the word driver 63a according to the third embodiment independently controls the rise operation and the fall operation of the word line WL. At a rise time of the word line WL, an output signal of the driver 69e is supplied to the driver 69d via the transistor N33, and the driver 69e is controlled by a signal of the amplitude VDD output from the row decoder 61a. At a fall time of the word line WL, a pull-up potential VPP is supplied to an input terminal of the driver 69d via the P-channel transistor P32, and the P-channel transistor P32 is controlled by a signal of the amplitude VPP output from the row decoder 61a. Therefore, the word line can be driven stably at a high speed.

Figure 11:
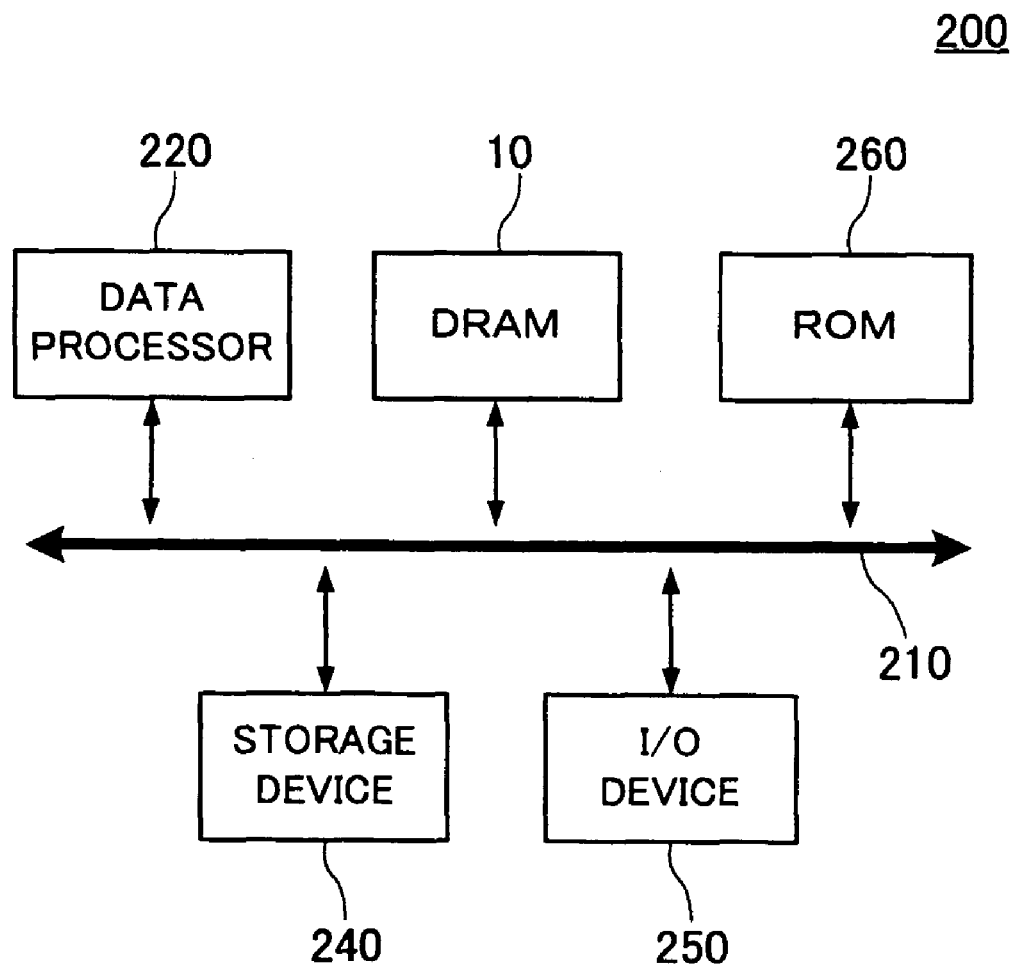
FIG. 11 is a block diagram showing a configuration of a data processing system using the semiconductor device according to the present embodiment.

FIG. 11 is a block diagram showing a configuration of a data processing system 200 using the semiconductor device 10 according to the present embodiment.

The data processing system 200 shown in FIG. 11 has a configuration that a data processor 220 and the semiconductor device (DRAM) 10 are connected to each other via a system bus 210. The data processor 220 includes a microprocessor (MPU) and a digital signal processor (DSP) and the like. Although the data processor 220 and the DRAM 10 are connected to each other via the system bus 210 for simplicity in FIG. 11, these units can be connected to each other via a local bus without via the system bus 210.

Although FIG. 11 shows only one system bus 210 for simplicity, plural system buses 210 can be provided serially or in parallel via connectors as necessary. In a memory-system data processing system shown in FIG. 11, a storage device 240, an I/O device 250, and a ROM 260 are connected to the system bus 210, but these are not necessarily essential constituent elements.

The storage device 240 can include a hard disk drive, an optical disk drive, and a flash memory. The I/O device 250 can include a display device such as a liquid crystal display, and an input device such as a keyboard and a mouse. The I/O device 250 can be either an input device or an output device. In addition, although FIG. 11 shows each of the constituent elements as one for simplicity, the present invention is not limited thereto and it is also possible to provide these constituent elements in plural.

In the above configuration, a signal from a data processor 220 is supplied to the DRAM 10 via the system bus 210. The DRAM 10 processes the signal from the data processor 220 having the amplitude VDD by converting the signal to a low voltage signal of the internal operation voltage VPERI. Data read from a memory cell of the DRAM 10 is converted to a signal having the amplitude VDD, and is transferred to the data processor 220 via the system bus 210.

It is apparent that the present invention is not limited to the above embodiments, but may be modified and changed without departing from the scope and spirit of the invention.

For example, in the above embodiments, the present invention has been explained based on voltage conditions of the DDR3 SDRAM of the 50-nm generation, that is, VDD=1.5 V, VPERI=1.0 V, VPP=2.6 V, and VARY=1.0 V. However, the present invention is not limited to such voltage conditions, and as far as a voltage condition of VPP>VDD>VPERI≈VARY is satisfied, the present invention can be applied to various types of semiconductor devices such as CPU (Central Processing Unit), MCU (Micro Control Unit), DSP (Digital Signal Processor), ASIC (Application Specific Integrated Circuit), and ASSP (Application Specific Standard Circuit).

Furthermore, in the above embodiments, while the level shifters 53 and 54 for increasing the voltage VDD are provided in both the column system and the row system, it is also possible to have a configuration in which only one of these level shifters is provided.

Moreover, the characteristics of the column system circuit shown in FIG. 8, that the amplitude of the decoded signal supplied from the column decoder 65 is level shifted to VDD level by the level shifter, can be applied to the row system circuit shown in FIG. 1, 8 or 9.

What is claimed is:

1. A semiconductor device comprising:
an input buffer that receives an address signal having a first amplitude;
a first level shifter that converts an amplitude of the address signal output from the input buffer to a second amplitude that is smaller than the first amplitude;
an address controller that receives the address signal output from the first level shifter;
an address decoder that generates a decode signal by decoding the address signal output from the address controller; and
a second level shifter that converts an amplitude of the address signal output from the address controller or of the decode signal output from the address decoder from the second amplitude to the first amplitude such that at least an amplitude of the decode signal becomes the first amplitude.

2. The semiconductor device as claimed in claim 1, wherein
the address signal includes a column address signal,
the address controller includes a column address controller that receives the column address signal,
the address decoder includes a column decoder that decodes the column address signal to generate a column selection signal, and
the column selection signal is supplied to a control electrode of a column switch that selects a bit line.

3. The semiconductor device as claimed in claim 2, wherein the second level shifter is provided between the column address controller and the column decoder, and converts an amplitude of the column address signal output from the column address controller from the second amplitude to the first amplitude.

4. The semiconductor device as claimed in claim 2, wherein the second level shifter is provided between the column decoder and the column switch, and converts an amplitude of the column selection signal from the second amplitude to the first amplitude.

5. The semiconductor device as claimed in claim 2, further comprising a sense amplifier connected to the bit line, wherein
the sense amplifier drives the bit line in an amplitude smaller than the second amplitude.

6. The semiconductor device as claimed in claim 1, wherein
the address signal includes a row address signal,
the address controller includes a row address controller that receives the row address signal, and
the address decoder includes a row decoder that decodes the row address signal to generate a row decode signal, wherein
the semiconductor device further comprises:
a word driver that selects a word line based on the row decode signal; and
a third level shifter that converts an amplitude of the row decode signal output from the row decoder or of an output signal of the word driver from the first amplitude to a third amplitude such that at least an amplitude level of an output signal of the word driver becomes the third amplitude that is larger than the first amplitude.

7. The semiconductor device as claimed in claim 6, further comprising:
   a sense amplifier connected to a bit line; and
   a sense amplifier driver that supplies an operation voltage to the sense amplifier based on the row decode signal.

8. The semiconductor device as claimed in claim 7, wherein
   the sense amplifier driver includes a first driver that supplies a first power source potential to the sense amplifier and a second driver that supplies a second power source potential to the sense amplifier,
   the row decode signal having the first amplitude is supplied to a control electrode of the first driver, and
   the row decode signal having the third amplitude is supplied to a control electrode of the second driver.

9. The semiconductor device as claimed in claim 8, wherein a potential difference between the first power source potential and the second power source potential is smaller than the second amplitude.

10. A semiconductor device comprising:
    an address terminal supplied with an address signal, the address signal changing between first and second potential levels;
    an internal address circuit coupled to the address terminal to receive the address signal and outputting an internal address signal, the internal address signal changing between the first potential level and a third potential level, the third potential level being lower than the second potential level; and
    an address decoder coupled to the internal address circuit to receive the internal address signal and outputting a decoded signal, the decoded signal changing between the first level and a fourth potential level, the fourth potential level being higher than the third potential level.

11. The device as claimed in claim 10, wherein the second potential level is substantially equal to the fourth potential level.

12. The device as claimed in claim 10, wherein the address decoder comprises a first level shifter shifting a level of the internal address signal to produce an intermediate address signal that changes between the first and fourth potential levels, and a column decoder coupled to the first level shifter to receive the intermediate address signal, the address decoder further comprises column address decoder operating on the fourth potential level to produce a column address decoded signal as the decoded signal changing between the first and fourth potential levels.

13. The device as claimed in claim 10, wherein the address decoder comprises a column address decoder decoding the internal address signal, the column decoder operating on the third potential level to produce an intermediate decoded signal that changes between the first and third potential levels, and the address decoder further comprises a second level shifter coupled to the column address decoder to receive the intermediate decoded signal and shifting a level of the intermediate decoded signal to produce a column address decoded signal as the decoded signal changing between the first and fourth potential levels.

14. The device as claimed in claim 10, wherein the address decoder comprises a third level shifter shifting a level of the internal address signal to produce an intermediate address signal that changes between the first and fourth potential levels, and a row address decoder coupled to the third level shifter to receive the intermediate address signal, the row address decoder operating on the fourth potential level to output a row address decoded signal as the decoded signal changing between the first and fourth potential levels.

15. The device as claimed in claim 10, wherein the address decoder a row address decoder decoding the internal address signal, the row address decoder operating on the third potential level to produce an intermediate decoded signal that changed between the first and third potential levels, and the address decoder further comprises a fourth level shifter coupled to the row address decoder to receive the intermediate decoded signal and shifting a level of the intermediated decided signal to produce a row address decoded signal as the decoded signal changing between the first and fourth potential levels.

16. A semiconductor device comprising:
    a set of address terminals supplied with a set of address signals including row address information and column address information, each of the address signals changing between first and second potential levels;
    an internal address circuit coupled to the set of address terminals to receive the set of address signals and outputting a set of internal address signals including row address information and column address information, each of the internal address signals changing between the first potential level and a third potential level, the third potential level being lower than the second potential level;
    a row address circuit coupled to the internal address circuit to receive the row address information of the set of internal address signals and outputting a set of row address decoded signals; and
    a column address circuit coupled to the internal address circuit to receive the column address information of the set of the internal address signals and outputting a set of column address decoded signals;
    at least one of the row address circuit and the column address circuit changing an associated one of the set of the row address decoded signals and the set of the column address decoded signals between the first potential level and a fourth potential level that is substantially equal to the second potential level.

17. The device as claimed in claim 16, wherein the at least one of the row address circuit and the column address circuit comprises a first level shifter shifting a level of the set of the internal address signals and outputting a set of intermediate address signals each changing between the first and fourth potential levels, and the at least one of the row address circuit and the column address circuit further comprises an address decoder operating on the fourth potential level to decode the set of internal address signals and outputting the associated one of the set of the row address decoded signals and the set of the column address decoded signals that changes between the first and fourth potential levels.

18. The device as claimed in claim 16, wherein the at least one of the row address circuit and the column address circuit comprises an address decoder operating on the second potential level to decode the set of internal address signals and outputting a set of intermediate decoded signals changing between the first and second potential levels, and the at least one of the row address circuit and the column address circuit further comprises a second level shifter shifting a level of the set of the intermediate decoded signals and outputting the associated one of the set of the row address decoded signals and the set of the column address decoded signals.

19. The device as claimed in claim 16, wherein the row address circuit changes the set of the row address decoded signals between the first and fourth potential levels and the column address circuit changes the set of the column address decoded signals between the first and fourth potential levels.

20. The device as claimed in claim 19, each of the row and column address circuits comprises a level shifter circuit and an decoder circuit coupled in series, one of the level shifter circuit and the decoder circuit operating on the third potential levels and the other of the level shifter circuit and the decoder circuit operating on the fourth potential levels.

* * * * *